(12) United States Patent
Imai et al.

(10) Patent No.: US 11,063,171 B2
(45) Date of Patent: Jul. 13, 2021

(54) LIGHT EMITTING DEVICE, METHOD OF MANUFACTURING LIGHT EMITTING DEVICE, AND PROJECTOR

(71) Applicant: Seiko Epson Corporation, Tokyo (JP)

(72) Inventors: Yasutaka Imai, Suwa (JP); Tetsuji Fujita, Chino (JP); Koichiro Akasaka, Ina (JP); Hideki Hahiro, Yamagata (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/835,407

(22) Filed: Mar. 31, 2020

(65) Prior Publication Data

US 2020/0313032 A1    Oct. 1, 2020

(30) Foreign Application Priority Data

Apr. 1, 2019 (JP) .............................. JP2019-069998

(51) Int. Cl.

| | |
|---|---|
| *H01L 33/16* | (2010.01) |
| *H01L 33/32* | (2010.01) |
| *H01S 5/20* | (2006.01) |
| *H01L 33/00* | (2010.01) |
| *H01S 5/11* | (2021.01) |

(52) U.S. Cl.
CPC ........ *H01L 33/0004* (2013.01); *H01L 33/007* (2013.01); *H01L 33/16* (2013.01); *H01L 33/32* (2013.01); *H01S 5/11* (2021.01); *H01S 5/2031* (2013.01)

(58) Field of Classification Search
CPC ......... H01L 33/08; H01L 33/16; H01S 5/105; H01S 5/2031
See application file for complete search history.

(56) References Cited

U.S. PATENT DOCUMENTS

| | | |
|---|---|---|
| 2008/0012030 A1 | 1/2008 | Yoon et al. |
| 2011/0126891 A1 | 6/2011 | Goto et al. |
| 2011/0169025 A1 | 7/2011 | Kishino et al. |
| 2013/0092899 A1 | 4/2013 | Svensson |
| 2014/0077158 A1 | 3/2014 | Crowder et al. |

FOREIGN PATENT DOCUMENTS

| | | |
|---|---|---|
| JP | 2011-135058 A | 7/2011 |
| JP | 2013-239718 A | 11/2013 |
| JP | 2014-154673 A | 8/2014 |
| JP | 2016-042583 A | 3/2016 |

*Primary Examiner* — Zandra V Smith
*Assistant Examiner* — Molly K Reida
(74) *Attorney, Agent, or Firm* — Harness, Dickey & Pierce, P.L.C.

(57) ABSTRACT

A light emitting device includes a substrate, and a laminated structure provided on the substrate, wherein the laminated structure has a plurality of columnar portions, the columnar portion contains a material having a wurtzite-type crystal structure, in a plan view as seen from a layered direction of the laminated structure, the plurality of columnar portions are arranged in a square lattice form or rectangular lattice form, a line passing through centers of the adjacent columnar portions is inclined relative to m-planes of the columnar portions located between the centers of the adjacent columnar portions, and vertices of the adjacent columnar portions are not placed on the line.

7 Claims, 14 Drawing Sheets

LIGHT EMITTING DEVICE, METHOD OF MANUFACTURING LIGHT EMITTING DEVICE, AND PROJECTOR

The present application is based on, and claims priority from JP Application Serial Number 2019-069998, filed Apr. 1, 2019, the disclosure of which is hereby incorporated by reference herein in its entirety.

BACKGROUND

1. Technical Field

The present disclosure relates to a light emitting device, a method of manufacturing the light emitting device, and a projector.

2. Related Art

These days, development of small projectors including nanocolumns as light sources are advanced. The small projectors may have light sources with higher efficiency, higher intensity, and longer lives than LED (Light Emitting Diode) light sources of related art, and attract attention as environment-friendly energy-saving projectors.

For example, JP-A-2013-239718 discloses a growth of nanocolumns from a semiconductor substrate toward above a mask pattern via a plurality of opening portions using the MOCVD (Metal Organic Chemical Vapor Deposition) method, MBE (Molecular Beam Epitaxy) method, or the like.

However, during the growth of columnar portions, the columnar portions may grow in lateral directions and the adjacent columnar portions may contact.

SUMMARY

An aspect of a light emitting device according to the present disclosure includes a substrate, and a laminated structure provided on the substrate, wherein the laminated structure has a plurality of columnar portions, the columnar portion contains a material having a wurtzite-type crystal structure, in a plan view as seen from a layered direction of the laminated structure, the plurality of columnar portions are arranged in a square lattice form or rectangular lattice form, a line passing through centers of the adjacent columnar portions is inclined relative to m-planes of the columnar portions located between the centers of the adjacent columnar portions, and vertices of the adjacent columnar portions are not placed on the line.

In the aspect of the light emitting device, in the plan view as seen from the layered direction, the line may be inclined at from 8 degrees to 22 degrees relative to perpendiculars of the m-planes.

An aspect of a light emitting device according to the present disclosure includes a substrate, and a laminated structure provided on the substrate, wherein the laminated structure has a plurality of columnar portions, the columnar portion contains a material having a wurtzite-type crystal structure, in a plan view as seen from a layered direction of the laminated structure, the plurality of columnar portions are arranged in a regular triangular lattice form, a line passing through centers of the adjacent columnar portions is inclined relative to m-planes of the columnar portions located between the centers of the adjacent columnar portions, and vertices of the adjacent columnar portions are not placed on the line.

In the aspect of the light emitting device, in the plan view as seen from the layered direction, the line may be inclined at from 8 degrees to 22 degrees relative to perpendiculars of the m-planes.

In the aspect of the light emitting device, in the plan view as seen from the layered direction, the line may be inclined at from 38 degrees to 52 degrees relative to a perpendicular of an m-plane connected to the m-plane in a clockwise direction.

An aspect of a method of manufacturing a light emitting device according to the present disclosure includes forming a laminated structure having a plurality of columnar portions on a substrate, wherein the columnar portion contains a material having a wurtzite-type crystal structure, at forming the laminated structure, in a plan view as seen from a layered direction of the laminated structure, the plurality of columnar portions are arranged in a square lattice form or rectangular lattice form, a line passing through centers of the adjacent columnar portions is inclined relative to m-planes of the columnar portions located between the centers of the adjacent columnar portions, and vertices of the adjacent columnar portions are not placed on the line.

In the aspect of the method of manufacturing a light emitting device, at forming the laminated structure, in the plan view as seen from the layered direction, the line may be inclined at from 8 degrees to 22 degrees relative to perpendiculars of the m-planes.

An aspect of a method of manufacturing a light emitting device according to the present disclosure includes forming a laminated structure having a plurality of columnar portions on a substrate, wherein the columnar portion contains a material having a wurtzite-type crystal structure, at forming the laminated structure, in a plan view as seen from a layered direction of the laminated structure, the plurality of columnar portions are arranged in a regular triangular lattice form, a line passing through centers of the adjacent columnar portions is inclined relative to m-planes of the columnar portions located between the centers of the adjacent columnar portions, and vertices of the adjacent columnar portions are not placed on the line.

In the aspect of the method of manufacturing a light emitting device, at forming the laminated structure, in the plan view as seen from the layered direction, the line may be inclined at from 8 degrees to 22 degrees relative to perpendiculars of the m-planes.

In the aspect of the method of manufacturing a light emitting device, at forming the laminated structure, in the plan view as seen from the layered direction, the line may be inclined at from 38 degrees to 52 degrees relative to a perpendicular of an m-plane connected to the m-plane in a clockwise direction.

An aspect of a projector according to the present disclosure includes the above described aspect of the light emitting device.

DESCRIPTION OF EXEMPLARY EMBODIMENTS

As below, preferred embodiments of the present disclosure will be explained using the drawings. Note that the following embodiments do not unduly limit the present disclosure described in the appended claims. Not all of the configurations to be explained are essential component elements of the present disclosure.

1. First Embodiment

1.1. Light Emitting Device

1.1.1. Configuration

Figure 1:
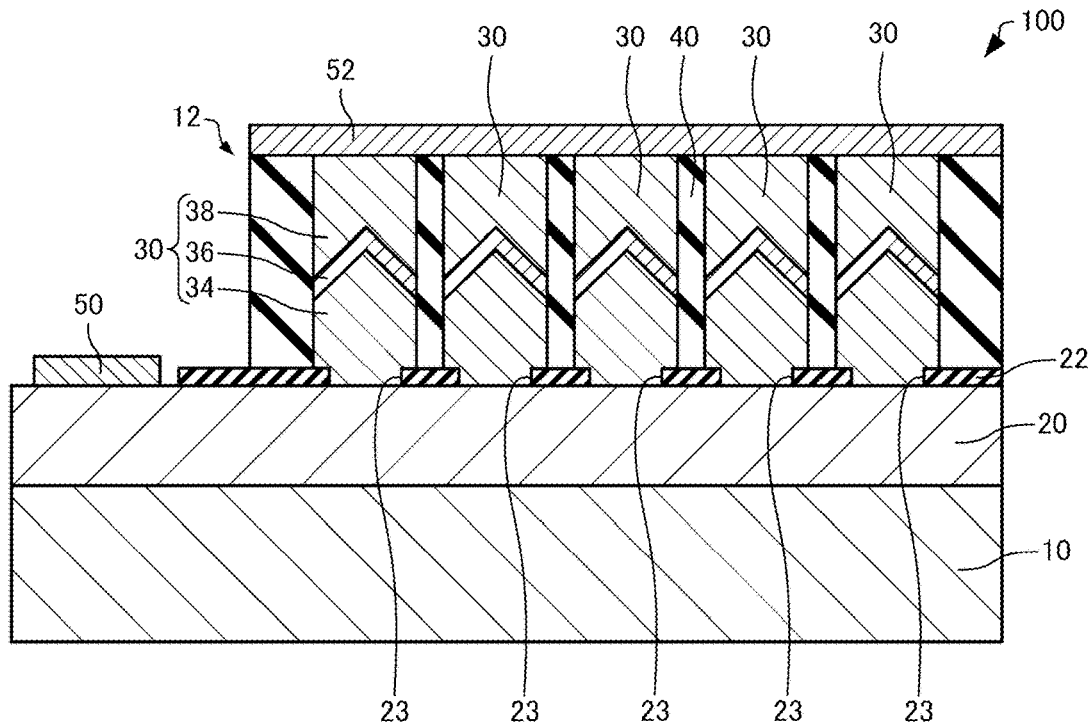
FIG. 1 is a sectional view schematically showing a light emitting device according to a first embodiment.
Figure 2:
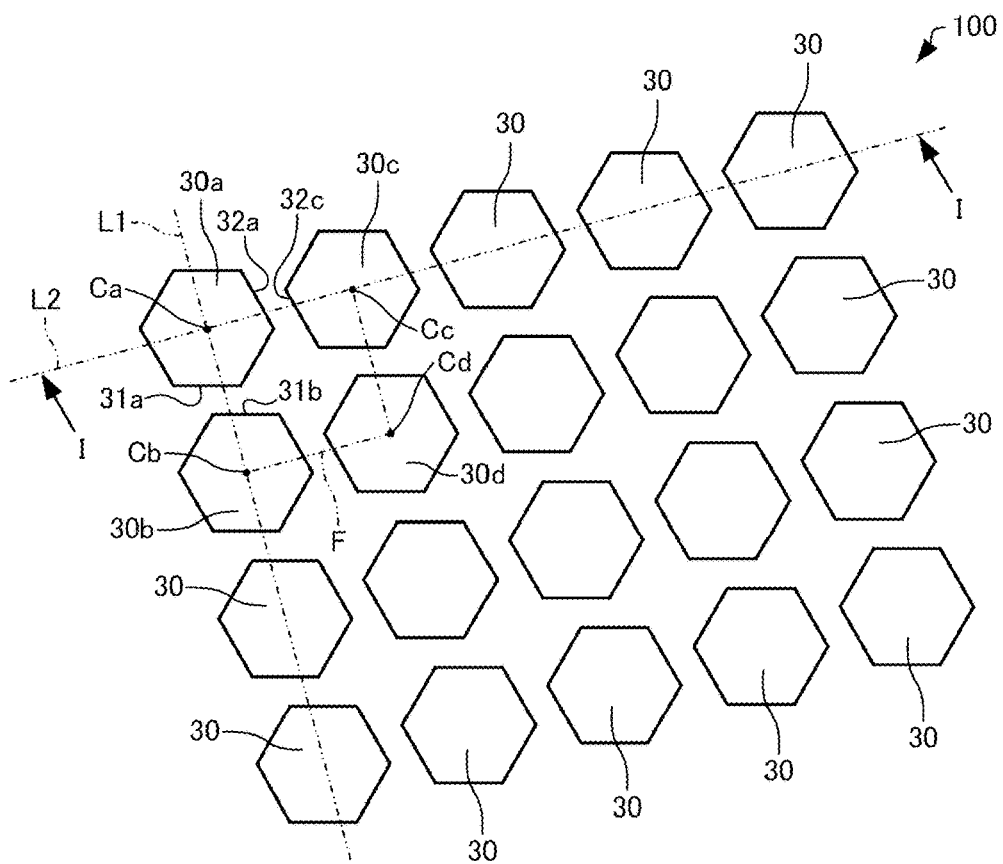
FIG. 2 is a plan view schematically showing the light emitting device according to the first embodiment.

First, a light emitting device according to the first embodiment will be explained with reference to the drawings. FIG. 1 is the sectional view schematically showing the light emitting device 100 according to the first embodiment. FIG. 2 is the plan view schematically showing the light emitting device 100 according to the first embodiment. FIG. 1 is the sectional view along line I-I in FIG. 2.

As shown in FIG. 1, the light emitting device 100 has e.g. a substrate 10, a multilaminated structure 12 provided on the substrate 10, a first electrode 50, and a second electrode 52. The multilaminated structure 12 has a buffer layer 20, a mask layer 22, columnar portions 30, and a light propagation layer 40. For convenience, in FIG. 2, illustration of the other members than the columnar portions 30 is omitted.

The substrate 10 is e.g. a sapphire substrate, GaN substrate, Si substrate, or the like.

The buffer layer 20 is provided on the substrate 10. The buffer layer 20 is e.g. a Si-doped n-type GaN layer or the like.

Note that "upper" refers to a direction away from the substrate 10 as seen from a light emitting layer 36 in a layered direction of the multilaminated structure 12 (hereinafter, also simply referred to as "layered direction"), and "lower" refers to a direction toward the substrate 10 as seen from the light emitting layer 36 in the layered direction. The layered direction of the laminated structure 12 is a layered direction of a first semiconductor layer 34 and the light emitting layer 36 of the columnar portion 30. Hereinafter, a direction orthogonal to the layered direction is also referred to as "in-plane direction of the substrate 10".

The mask layer 22 is provided on the buffer layer 20. A plurality of opening portions 23 are provided in the mask layer 22. As seen from the layered direction, the shape of the opening portion 23 is e.g. a circular shape. The columnar portion 30 is provided in the opening portion 23. The mask layer 22 is a layer that functions as a mask for growing the columnar portions 30. The material of the mask layer 22 is e.g. an $SiO_2$ layer, Si layer, SiC layer, $TiO_2$ layer, $HfO_2$ layer, or the like.

The columnar portions 30 are provided on the buffer layer 20. The columnar portion 30 is formed using a GaN-based material containing gallium (Ga) and nitrogen (N). The GaN-based material has a wurtzite-type crystal structure, and the columnar portion 30 tends to grow in a planar shape of regular hexagon. In the example shown in FIG. 2, the planar shape of the columnar portion 30 is a regular hexagonal shape. For example, the diameter of the columnar portion 30 is on the order of nanometers, and specifically from 50 nm to 500 nm. The size of the columnar portion 30 in the layered direction is e.g. from 0.5 μm to 3 μm. The material having the wurtzite-type crystal structure includes e.g. an AlN-based material, ZnO-based material, ZnS-based material, and InN-based material in addition to the GaN-based material.

Note that "diameter" is a diameter of the smallest circle internally containing the columnar portion 30 having a polygonal planar shape, i.e., the smallest enclosing circle. Further, "planar shape" refers to a shape as seen from the layered direction. The center of the columnar portion 30 is the center of the smallest enclosing circle.

A plurality of the columnar portions 30 are provided. The columnar portions 30 are periodically arranged in predetermined directions in predetermined pitches. The pitch of the columnar portions 30 is e.g. from 200 nm to 1 μm. Here, "pitch" refers to a distance for single period when the columnar portions 30 are periodically arranged. In this case, the pitch is e.g. a distance between the centers of the adjacent columnar portions 30.

The columnar portion 30 has the first semiconductor layer 34, the light emitting layer 36, and a second semiconductor layer 38.

The first semiconductor layer 34 is provided on the buffer layer 20. The first semiconductor layer 34 is e.g. a Si-doped n-type GaN layer.

The light emitting layer 36 is provided on the first semiconductor layer 34. The light emitting layer 36 is provided between the first semiconductor layer 34 and the second semiconductor layer 38. The light emitting layer 36 has a quantum well structure formed by e.g. a GaN layer and an InGaN layer. The light emitting layer 36 is a layer that can emit light when a current is injected thereto.

The second semiconductor layer 38 is provided on the light emitting layer 36. The second semiconductor layer 38 is a layer having a different conductivity type from the first semiconductor layer 34. The second semiconductor layer 38 is e.g. an Mg-doped p-type GaN layer. The semiconductor layers 34, 38 are cladding layers having functions of confining light in the light emitting layer 36.

In the light emitting device 100, a pin diode is formed by the p-type second semiconductor layer 38, the light emitting layer 36 doped with no impurity, and the n-type first semiconductor layer 34. In the light emitting device 100, when a forward bias voltage is applied and a current is injected between the first electrode 50 and the second electrode 52, electron-hole recombination occurs in the light emitting layer 36. Light is emitted by the recombination. The lights emitted in the light emitting layers 36 propagate through the light propagation layer 40 in the in-plane directions of the substrate 10 by the semiconductor layers 34, 38, form standing wave by the effect of photonic crystal by the plurality of columnar portions 30, and are confined in the in-plane directions of the substrate 10. The confined lights laser-oscillate with gain in the light emitting layers 36. Then, the light emitting device 100 outputs +1st-order diffracted light and −1st-order diffracted light as a laser beam in the layered direction.

Note that a reflection layer (not shown) may be provided between the substrate 10 and the buffer layer 20 or under the substrate 10. The reflection layer is e.g. a DBR (Distributed Bragg Reflector) layer. By the reflection layer, the light generated in the light emitting layer 36 may be reflected, and the light emitting device 100 may output light only from the second electrode 52 side.

The light propagation layer 40 is provided between the adjacent columnar portions 30. In the illustrated example, the light propagation layer 40 is provided on the mask layer 22. For example, the refractive index of the light propagation layer 40 is lower than the refractive index of the light emitting layer 36. The light propagation layer 40 is e.g. a silicon oxide layer, aluminum oxide layer, titanium oxide layer, or the like. The light generated in the light emitting layer 36 can propagate in the light propagation layer 40. Here, "adjacent columnar portions 30" refers to a first columnar portion 30 of the plurality of columnar portions 30 and a second columnar portion 30 at the shortest distance between centers to the first columnar portion 30 of the plurality of columnar portions 30.

The first electrode 50 is provided on the buffer layer 20. The buffer layer 20 may be in ohmic contact with the first electrode 50. In the illustrated example, the first electrode 50 is electrically coupled to the first semiconductor layer 34 via the buffer layer 20. The first electrode 50 is one electrode for current injection to the light emitting layer 36. As the first electrode 50, e.g. a laminated structure of a Ti layer, an Al layer, an Au layer sequentially from the buffer layer 20 side or the like is used.

The second electrode 52 is provided on the second semiconductor layer 38. The second semiconductor layer 38 may be in ohmic contact with the second electrode 52. The second electrode 52 is electrically coupled to the second semiconductor layer 38. The second electrode 52 is the other electrode for current injection to the light emitting layer 36. The material of the second electrode 52 is e.g. ITO (Indium Tin Oxide) or the like.

1.1.2. Arrangement of Columnar Portions

As shown in FIG. 2, the plurality of columnar portions 30 are arranged in a square lattice form in a plan view as seen from the layered direction. That is, of the plurality of columnar portions 30, a figure F formed by a line connecting a center Ca of a columnar portion 30a and a center Cb of a columnar portion 30b, a line connecting the center Ca of the columnar portion 30a and a center Cc of a columnar portion 30c, a line connecting the center Cb of the columnar portion 30b and a center Cd of a columnar portion 30d, and a line connecting the center Cc of the columnar portion 30c and the center Cd of the columnar portion 30d is a square. In the plan view as seen from the layered direction, the position of the center of the columnar portion 30 coincides with the position of the center of the opening portion 23 provided in the mask layer 22.

In the illustrated example, the columnar portion 30b is adjacent to the columnar portion 30a, and the columnar portion 30c is adjacent to the columnar portion 30a. In the illustrated example, the twenty columnar portions 30 are provided, however, the number of columnar portion 30 is not particularly limited.

Figure 3:
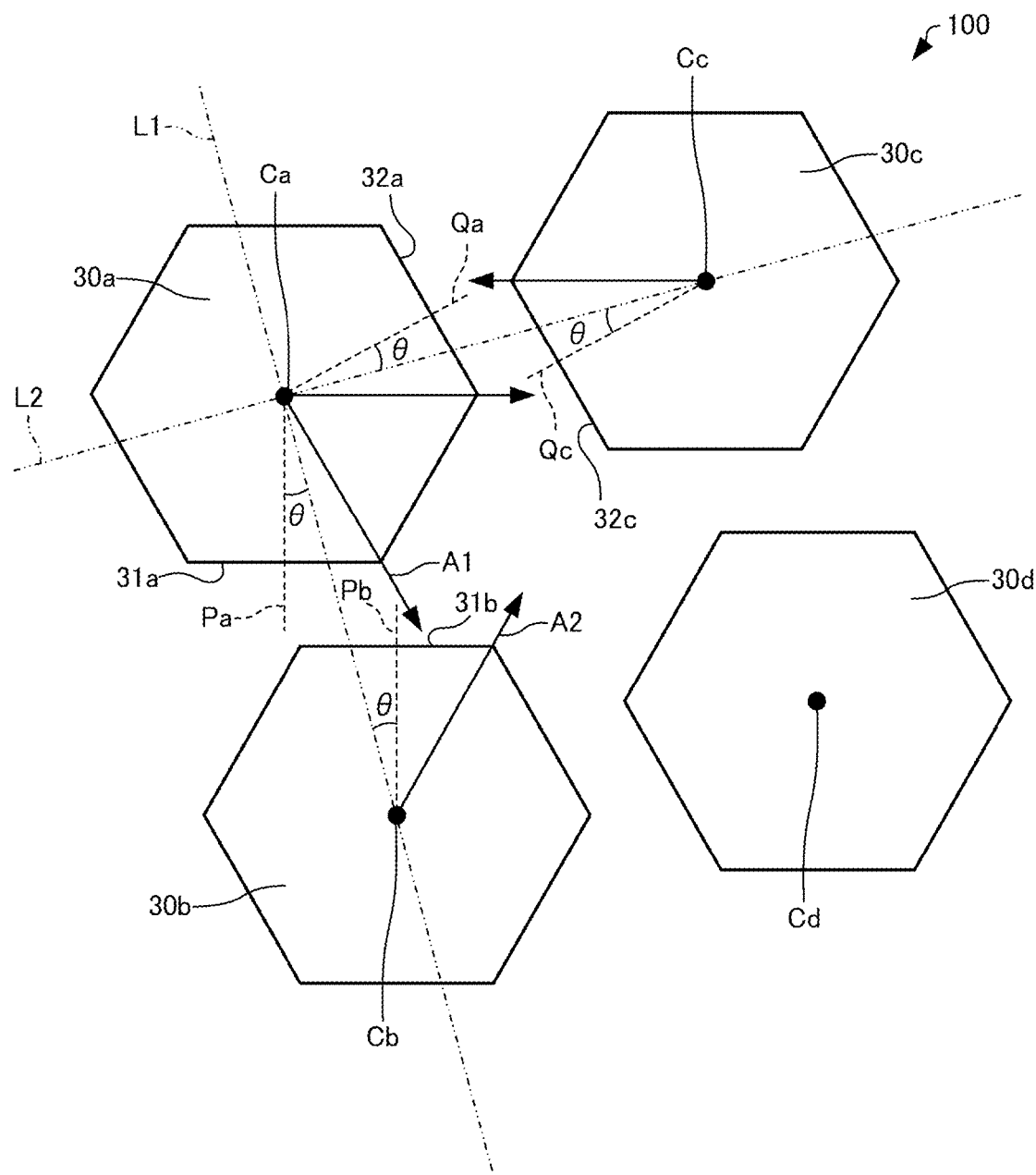
FIG. 3 is a plan view schematically showing the light emitting device according to the first embodiment.

Here, FIG. 3 is the plan view schematically showing the columnar portions 30a, 30b, 30c, 30d. As shown in FIGS. 2 and 3, in the plan view as seen from the layered direction, a line L1 is an imaginary line passing through the center Ca of the columnar portion 30a and the center Cb of the columnar portion 30b. The line L1 extends in a first direction.

The line L1 is inclined relative to m-planes 31a, 31b located between the centers Ca, Cb. The m-plane 31a is a face of the columnar portion 30a. The m-plane 31b is a face of the columnar portion 30b. For example, the m-plane 31a and the m-plane 31b are parallel. The columnar portion 30 has the six m-planes. The m-planes are side surfaces of the columnar portion 30. In the example shown in FIG. 2, the line L1 is not orthogonal to the m-planes of all columnar portions 30 and not parallel to the m-planes of all columnar portions 30.

As shown in FIG. 3, the line L1 is inclined e.g. at from 8 degrees to 22 degrees relative to a perpendicular Pa of the m-plane 31a and a perpendicular Pb of the m-plane 31b. An angle θ of the line L1 relative to the perpendicular Pa and an angle θ of the line L1 relative to the perpendicular Pb are the same angle and the angle θ is from 8 degrees to 22 degrees.

In the plan view as seen from the layered direction, vertices of the columnar portions 30a, 30b are not placed on the line L1. That is, the line L1 does not pass through the vertices of the columnar portions 30a, 30b. In the example shown in FIG. 2, the line L1 does not pass through the vertices of all columnar portions 30. The vertices of the columnar portions 30 are connecting points of the m-planes.

As shown in FIGS. 2 and 3, in the plan view as seen from the layered direction, a line L2 is an imaginary line passing through the center Ca of the columnar portion 30a and the center Cc of the columnar portion 30c. The line L2 extends in a second direction orthogonal to the first direction and orthogonal to the line L1.

The line L2 is inclined relative to m-planes 32a, 32c located between the centers Ca, Cc. The m-plane 32a is a face of the columnar portion 30a. The m-plane 32a is not connected to the m-plane 31a. The m-plane 32a is inclined at e.g. 60 degrees relative to the m-plane 31a. The m-plane 32c is a face of the columnar portion 30c. For example, the m-plane 32a and the m-plane 32c are parallel. In the example shown in FIG. 2, the line L2 is not orthogonal to the m-planes of all columnar portions 30 and not parallel to the m-planes of all columnar portions 30.

As shown in FIG. 3, the line L2 is inclined e.g. at from 8 degrees to 22 degrees relative to a perpendicular Qa of the m-plane 32a and a perpendicular Qc of the m-plane 32c. An angle θ of the line L2 relative to the perpendicular Qa and an angle θ of the line L2 relative to the perpendicular Qc are the same angle and the angle θ is from 8 degrees to 22 degrees.

In the plan view as seen from the layered direction, vertices of the columnar portions 30a, 30c are not placed on the line L2. That is, the line L2 does not pass through the vertices of the columnar portions 30a, 30c. In the example shown in FIG. 2, the line L2 does not pass through the vertices of all columnar portions 30.

1.1.3. Characteristics

For example, the light emitting device 100 has the following characteristics.

In the light emitting device 100, the multilaminated structure 12 has the plurality of columnar portions 30, the columnar portion 30 contains the material having the wurtzite-type crystal structure, in the plan view as seen from the layered direction, the plurality of columnar portions 30 are arranged in the square lattice form, the line L1 passing through the centers Ca, Cb of the adjacent columnar portions 30a, 30b is inclined relative to the m-planes 31a, 31b of the columnar portions 30a, 30b located between the centers Ca, Cb of the adjacent columnar portions 30a, 30b, and the vertices of the adjacent columnar portions 30a, 30b are not placed on the line L1. Accordingly, in the light emitting device 100, during the growth of the columnar portions 30, even when the columnar portions 30 grow in the lateral directions, i.e., the in-plane directions of the substrate 10, contact between the adjacent columnar portions 30a, 30b may be suppressed. If the adjacent columnar portions contact, power efficiency and the maximum optical output at light emission may be significantly reduced. Further, light at a desired wavelength is not emitted.

Here, the m-plane of the columnar portion 30 is a stable surface and, when the m-plane is formed when the columnar portion 30 grows, the columnar portion 30 is hard to grow from the m-plane in the lateral directions. Accordingly, when the columnar portion 30 grows in the lateral directions, as shown by arrows in FIG. 3, the columnar portion 30 grows from the vertex as the connecting point between the m-planes in a direction connecting the center of the columnar portion and the vertex.

Figure 4:
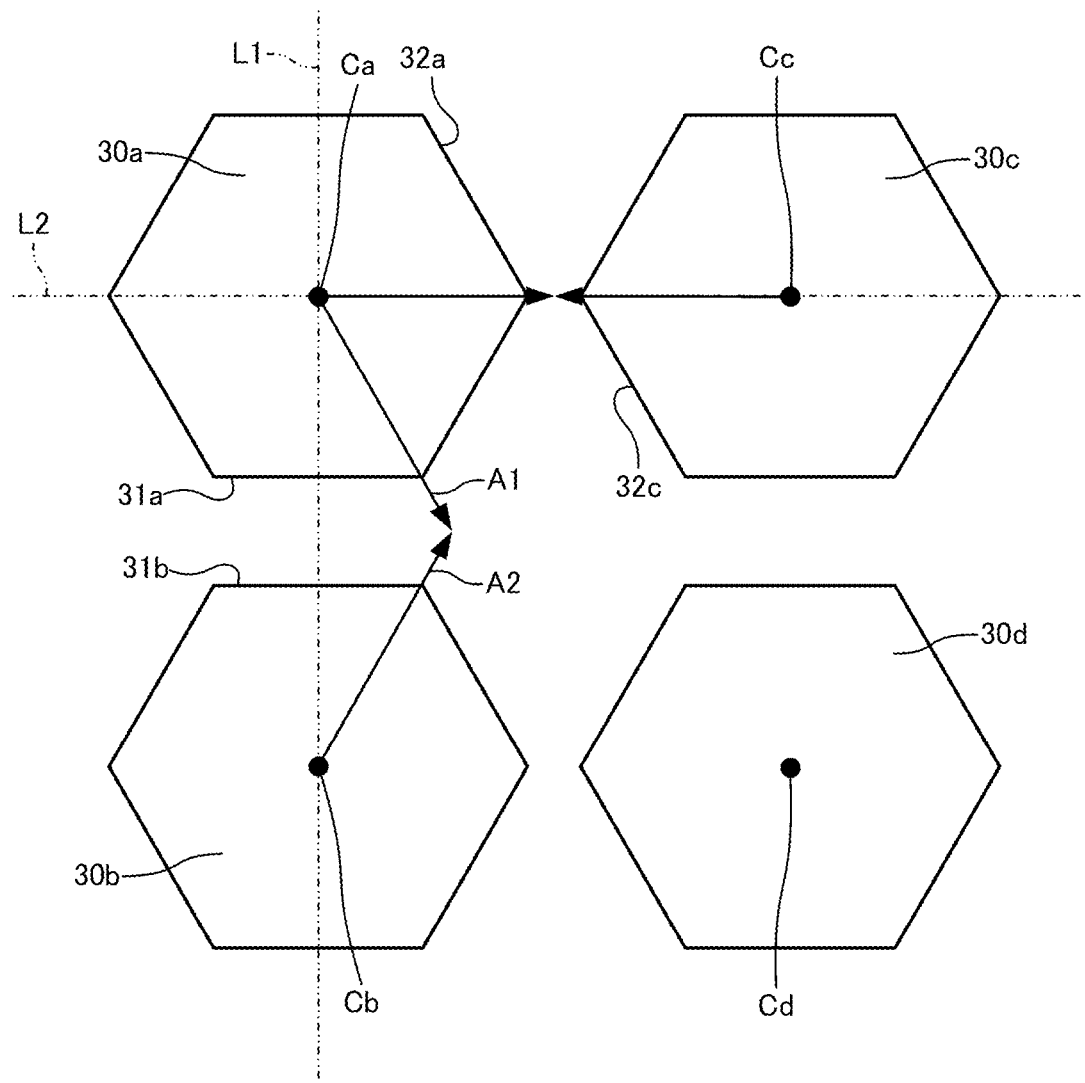
FIG. 4 is a plan view schematically showing columnar portions arranged in a square lattice form.

As described above, in the light emitting device 100, the line L1 is inclined relative to the m-planes 31a, 31b and the vertices of the adjacent columnar portions 30a, 30b are not placed on the line L1, and thereby, an arrow A1 passing through the center Ca and the vertex at the end of the m-plane 31a and an arrow A2 passing through the center Cb and the vertex at the end of the m-plane 31b may be prevented from being in contact. Accordingly, in the light emitting device 100, as shown in FIG. 4, compared to a case where the line L1 is orthogonal to the m-planes 31a, 31b, during the growth of the columnar portions 30, even when the columnar portions 30 grow in the lateral directions, the contact between the adjacent columnar portions 30a, 30b may be suppressed. Or, if the arrow A1 and the arrow A2 are in contact, for example, the distance between the center Ca and the connecting point between the arrow A1 and the arrow A2 may be made larger. Therefore, compared to the example shown in FIG. 4, the contact between the adjacent columnar portions 30a, 30b may be suppressed.

Note that the distance between the centers Ca, Cb shown in FIG. 4 is the same as the distance between the centers Ca, Cb shown in FIG. 3. Further, the distance between the centers Ca, Cc shown in FIG. 4 is the same as the distance between the centers Ca, Cc shown in FIG. 3.

Similarly, in the light emitting device 100, the line L2 passing through the centers Ca, Cc of the adjacent columnar portions 30a, 30c is inclined relative to the m-planes 32a, 32c of the columnar portions 30a, 30c located between the centers Ca, Cc of the adjacent columnar portions 30a, 30c, and the vertices of the adjacent columnar portions 30a, 30c are not placed on the line L2, and thereby, the contact between the adjacent columnar portions 30a, 30c may be suppressed.

In the light emitting device 100, in the plan view as seen from the layered direction, the line L1 is inclined at from 8 degrees to 22 degrees relative to the perpendiculars Pa, Pb of the m-planes 31a, 31b. Accordingly, in the light emitting device 100, the contact between the adjacent columnar portions 30a, 30b may be suppressed more reliably.

Figure 5:
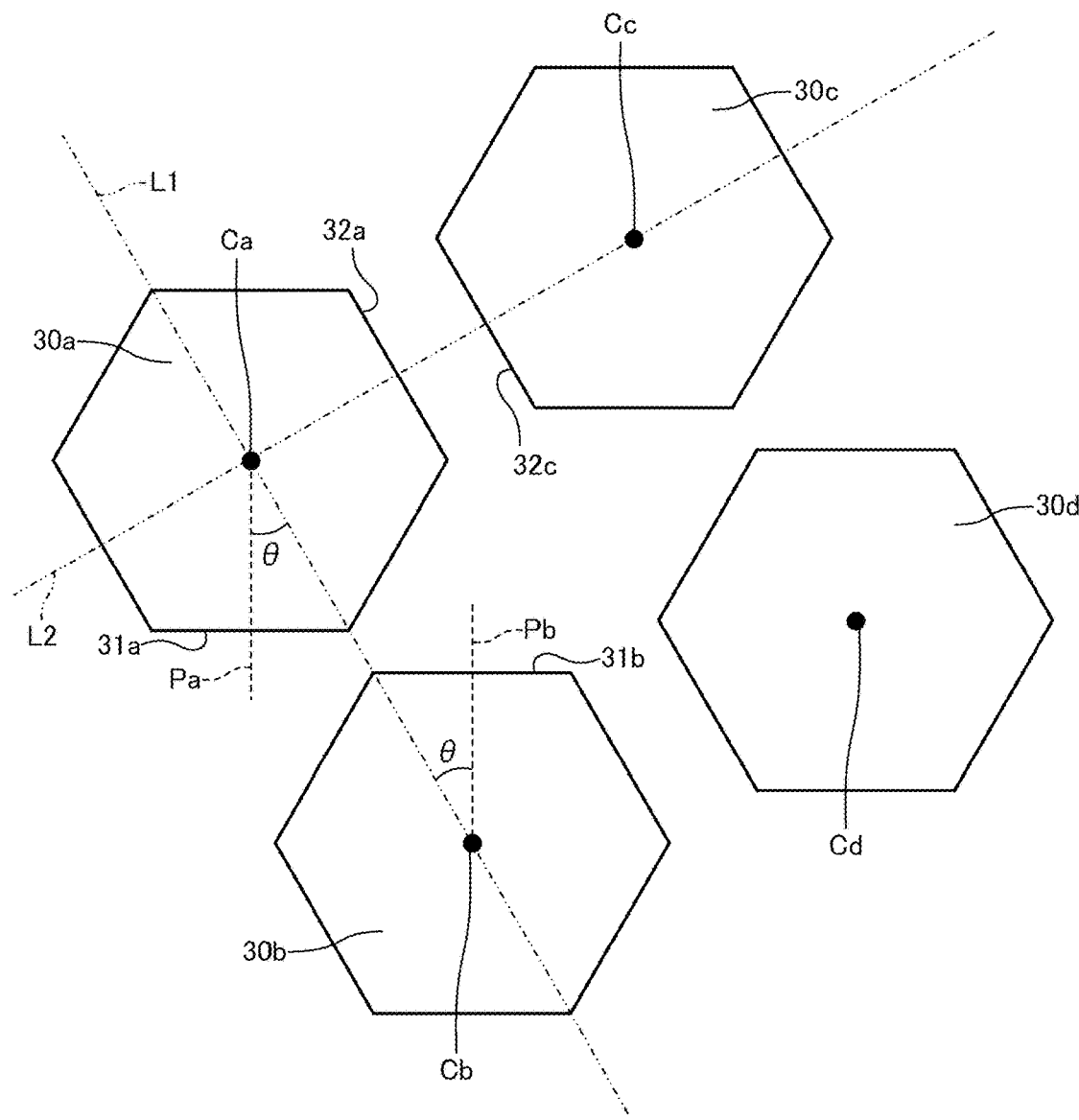
FIG. 5 is a plan view schematically showing columnar portions arranged in a square lattice form.

Here, as shown in "4. Practical Examples and Comparative Examples", which will be described later, a contact prevention effect between the adjacent columnar portions was confirmed when θ is 8 degrees. On the other hand when θ is 30 degrees, as shown in FIG. 5, the line L1 passes through the vertices of the columnar portions 30a, 30b and is substantially the same as that in the example shown in FIG. 4. Therefore, within the range 8°≤θ≤22°, which is obtained by subtraction of 8 degrees from 30 degrees, the contact between the adjacent columnar portions 30a, 30b may be suppressed more reliably.

Note that, in the above description, the InGaN-based light emitting layer 36 is explained, however, the light emitting layer 36 may be an AlGaN-based layer.

Further, in the above description, the case where the light emitting device 100 is a laser is explained, however, the light emitting device 100 may be an LED.

Furthermore, in the above description, the case where the columnar portion 30 has the light emitting layer 36 is explained, however, the columnar portion 30 does not necessarily have the light emitting layer 36. For example, a structure is provided between the plurality of columnar portions 30 and the second electrode 52, and the structure may have the first semiconductor layer 34, the second semiconductor layer 38, and the light emitting layer 36 provided between the first semiconductor layer 34 and the second semiconductor layer 38. In this case, the columnar portion 30 may be formed by an n-type semiconductor layer.

1.2. Method of Manufacturing Light Emitting Device

Figure 6:
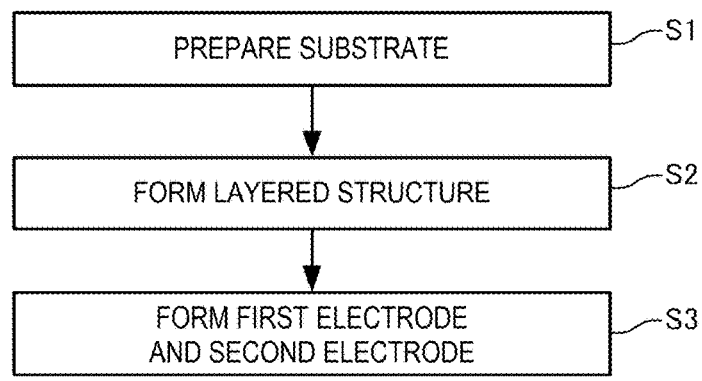
FIG. 6 is a flowchart for explanation of a method of manufacturing the light emitting device according to the first embodiment.
Figure 7:
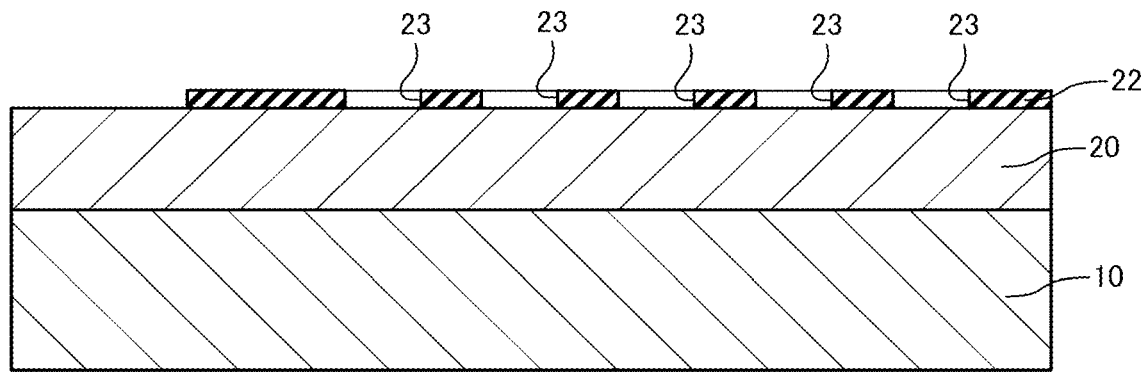
FIG. 7 is a sectional view schematically showing a manufacturing process of the light emitting device according to the first embodiment.

Next, a method of manufacturing the light emitting device 100 according to the first embodiment will be explained with reference to the drawings. FIG. 6 is the flowchart for explanation of the method of manufacturing the light emitting device 100 according to the first embodiment. FIG. 7 is the sectional view schematically showing the manufacturing process of the light emitting device 100 according to the first embodiment.

As shown in FIG. 7, the substrate 10 is prepared (step S1).

Then, the multilaminated structure 12 having the plurality of columnar portions 30 is formed on the substrate (step S2).

Specifically, the buffer layer 20 is epitaxially grown. The epitaxial growth method includes e.g. the MOCVD method and MBE method.

Then, the mask layer 22 is formed. The mask layer 22 is formed by e.g. the sputtering method. Then, the mask layer 22 is patterned and the opening portions 23 are formed. The patterning is performed by e.g. photolithography and etching.

As shown in FIG. 1, with the mask layer 22 as a mask, from the plurality of opening portions 23, the first semiconductor layers 34, the light emitting layers 36, and the second semiconductor layers 38 are epitaxially grown in this order on the buffer layer 20. The epitaxial growth method includes e.g. the MOCVD method and MBE method.

In this process, in the plan view as seen from the layered direction, the plurality of columnar portions 30 are arranged in the square lattice form. Further, the line L1 passing through the centers of the adjacent columnar portions 30a, 30b is inclined relative to the m-planes 31a, 31b of the columnar portions 30a, 30b located between the centers Ca, Cb of the adjacent columnar portions 30a, 30b. Furthermore, the vertices of the adjacent columnar portions 30a, 30b are not placed on the line L1. Moreover, the line L1 is inclined at e.g. from 8 degrees to 22 degrees relative to the perpendiculars Pa, Pb of the m-planes 31a, 31b. For example, in the wafer-shaped substrate 10, the orientation flat is set in a predetermined position, then, the wafer is rotated, the columnar portions 30 are grown from the opening portions 23 of the rotated wafer, and thereby, the angle θ may be set from 8 degrees to 22 degrees. Or, the angle θ may be set from 8 degrees to 22 degrees by adjustment of the mask for formation of the opening portions 23.

Then, the light propagation layer 40 is formed between the adjacent columnar portions 30. The light propagation layer 40 is formed by e.g. the spin-coating method.

In the above described process, the multilaminated structure 12 may be formed.

Then, the first electrode 50 is formed on the buffer layer 20 and the second electrode 52 is formed on the second semiconductor layer 38 (step S3). The first electrode 50 and the second electrode 52 are formed by e.g. the vacuum deposition method.

In the above described process, the light emitting device 100 may be manufactured.

As explained in "1.1.3. Characteristics", during the growth of the columnar portions 30, even when the columnar portions 30 grow in the lateral directions, the method of manufacturing the light emitting device 100 may suppress the contact between the adjacent columnar portions 30a, 30b.

Figure 8:
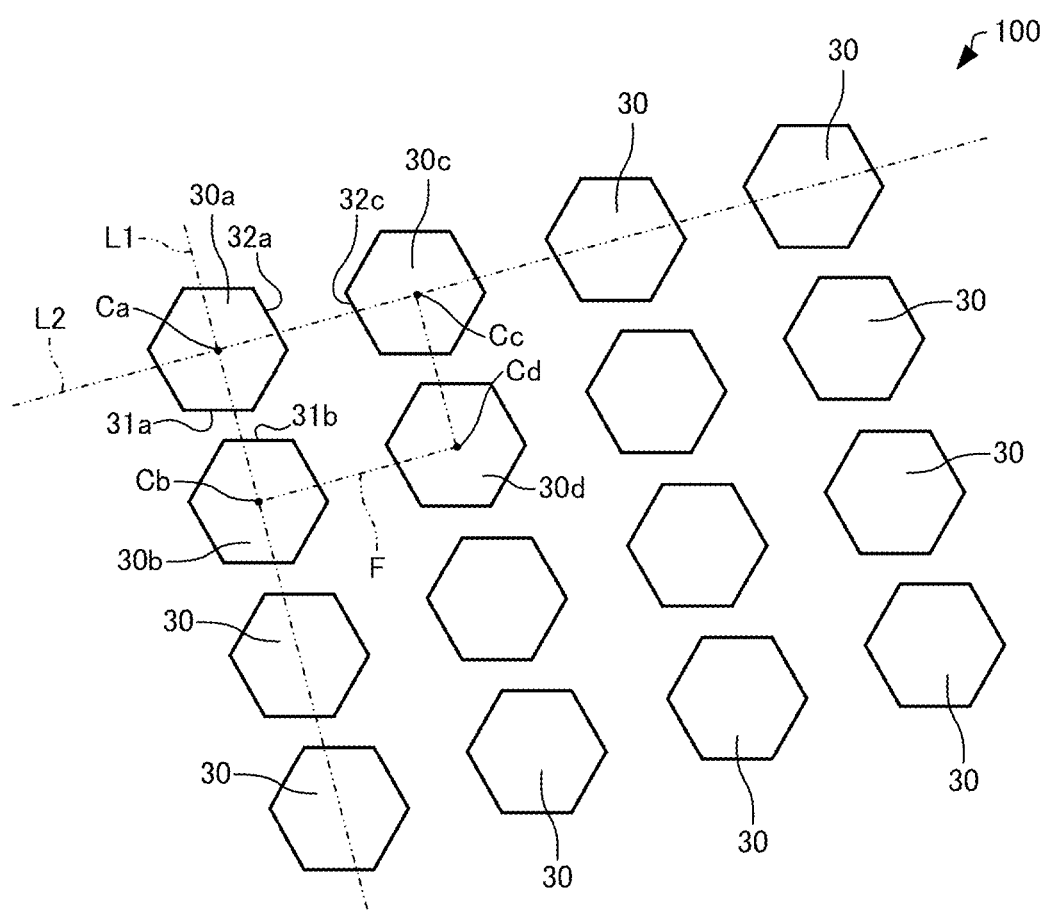
FIG. 8 is a plan view schematically showing the light emitting device according to the first embodiment.

Note that, in the above description, the plurality of columnar portions 30 are arranged in the square lattice form, however, the plurality of columnar portions 30 may be arranged in a rectangular lattice form as shown in FIG. 8. That is, of the plurality of columnar portions 30, the figure F formed by the line connecting the center Ca of the columnar portion 30a and the center Cb of the columnar portion 30b, the line connecting the center Ca of the columnar portion 30a and the center Cc of the columnar portion 30c, the line connecting the center Cb of the columnar portion 30b and the center Cd of the columnar portion 30d, and the line connecting the center Cc of the columnar portion 30c and the center Cd of the columnar portion 30d may be a rectangle. In the illustrated example, the distance between the center Ca of the columnar portion 30a and the center Cb of the columnar portion 30b is smaller than the distance between the center Ca of the columnar portion 30a and the center Cc of the columnar portion 30c. Even in this case, during the growth of the columnar portions 30, even when the columnar portions 30 grow in the lateral directions, the contact between the adjacent columnar portions 30a, 30b may be suppressed.

2. Second Embodiment 2.1. Light Emitting Device

Figure 9:
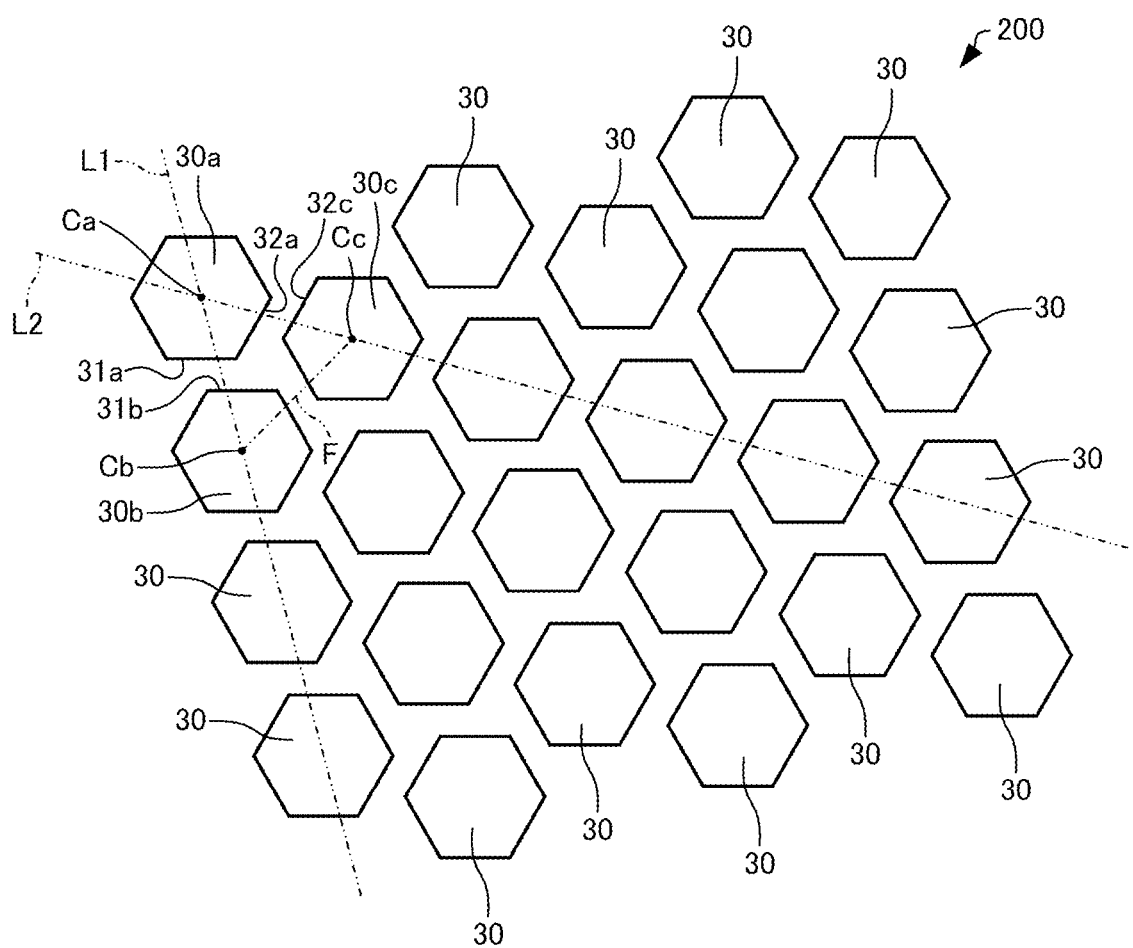
FIG. 9 is a plan view schematically showing a light emitting device according to a second embodiment.

Next, a light emitting device according to the second embodiment will be explained with reference to the drawings. FIG. 9 is the plan view schematically showing the light emitting device 200 according to the second embodiment. Note that, for convenience, in FIG. 9, illustration of the other members than the columnar portions 30 is omitted.

As below, in the light emitting device 200 according to the second embodiment, the differences from the example of the light emitting device 100 according to the above described first embodiment will be explained and the explanation of the same items will be omitted.

In the above described light emitting device 100, as shown in FIG. 2, the plurality of columnar portions 30 are arranged in the square lattice form in the plan view as seen from the layered direction.

On the other hand, in the light emitting device 200, as shown in FIG. 9, the plurality of columnar portions 30 are arranged in a regular triangular lattice form in the plan view as seen from the layered direction. That is, of the plurality of columnar portions 30, a figure F formed by a line connecting a center Ca of a columnar portion 30a and a center Cb of a columnar portion 30b, a line connecting the center Cb of the columnar portion 30b and a center Cc of a columnar portion 30c, and a line connecting the center Ca of the columnar portion 30a and the center Cc of the columnar portion 30c is a regular triangle.

Figure 10:
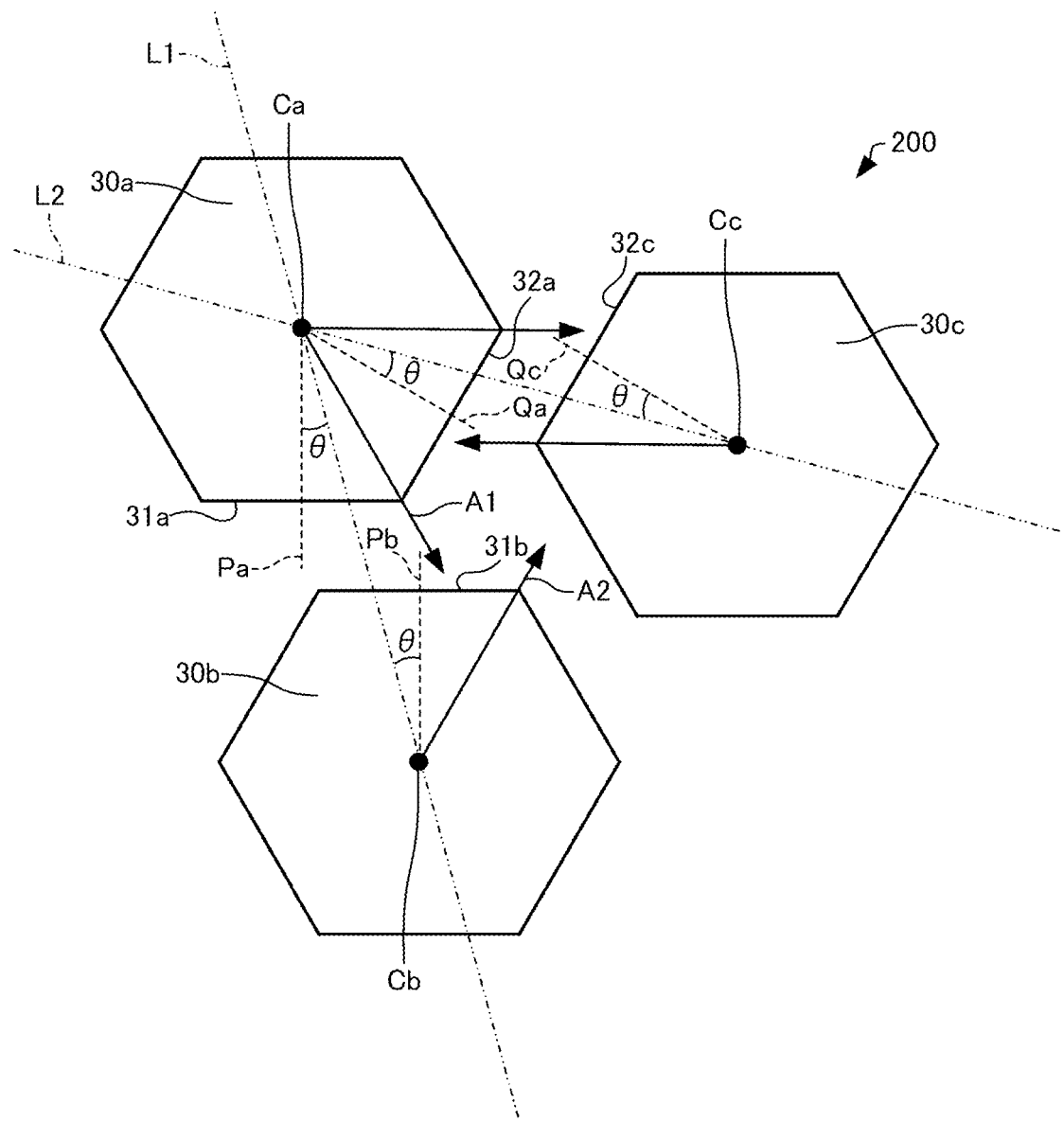
FIG. 10 is a plan view schematically showing the light emitting device according to the second embodiment.

Here, FIG. 10 is the plan view schematically showing the columnar portions 30a, 30b, 30c. As shown in FIGS. 9 and 10, in the plan view as seen from the layered direction, the line L1 and the line L2 cross at 60 degrees. The m-planes 31a, 32a of the columnar portion 30a are connected to each other.

In the light emitting device 200, in the plan view as seen from the layered direction, the plurality of columnar portions 30 are arranged in the regular triangular lattice form, and the line L1 passing through the centers Ca, Cb of the adjacent columnar portions 30a, 30b is inclined relative to the m-planes 31a, 31b of the columnar portions 30a, 30b located between the centers Ca, Cb of the adjacent columnar portions 30a, 30b, and the vertices of the adjacent columnar portions 30a, 30b are not placed on the line L1. Accordingly, in the light emitting device 200, compared to a case where the line L1 is orthogonal to the m-planes 31a, 31b as shown in FIG. 11 or a case where the line L1 passes through the vertices as shown in FIG. 12, during the growth of the columnar portions 30, contact between the adjacent columnar portions 30a, 30b may be suppressed like the light emitting device 100.

Figure 11:
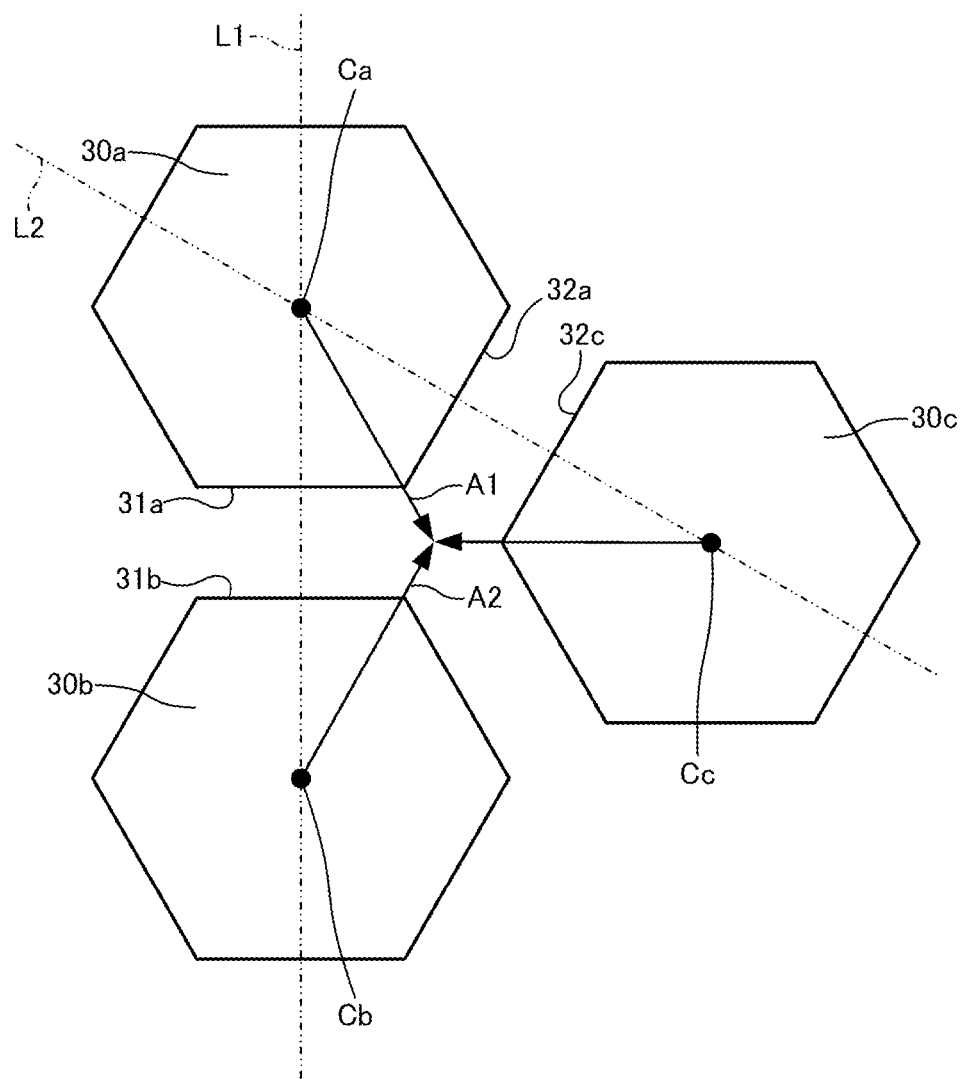
FIG. 11 is a plan view schematically showing columnar portions arranged in a regular triangular lattice form.
Figure 12:
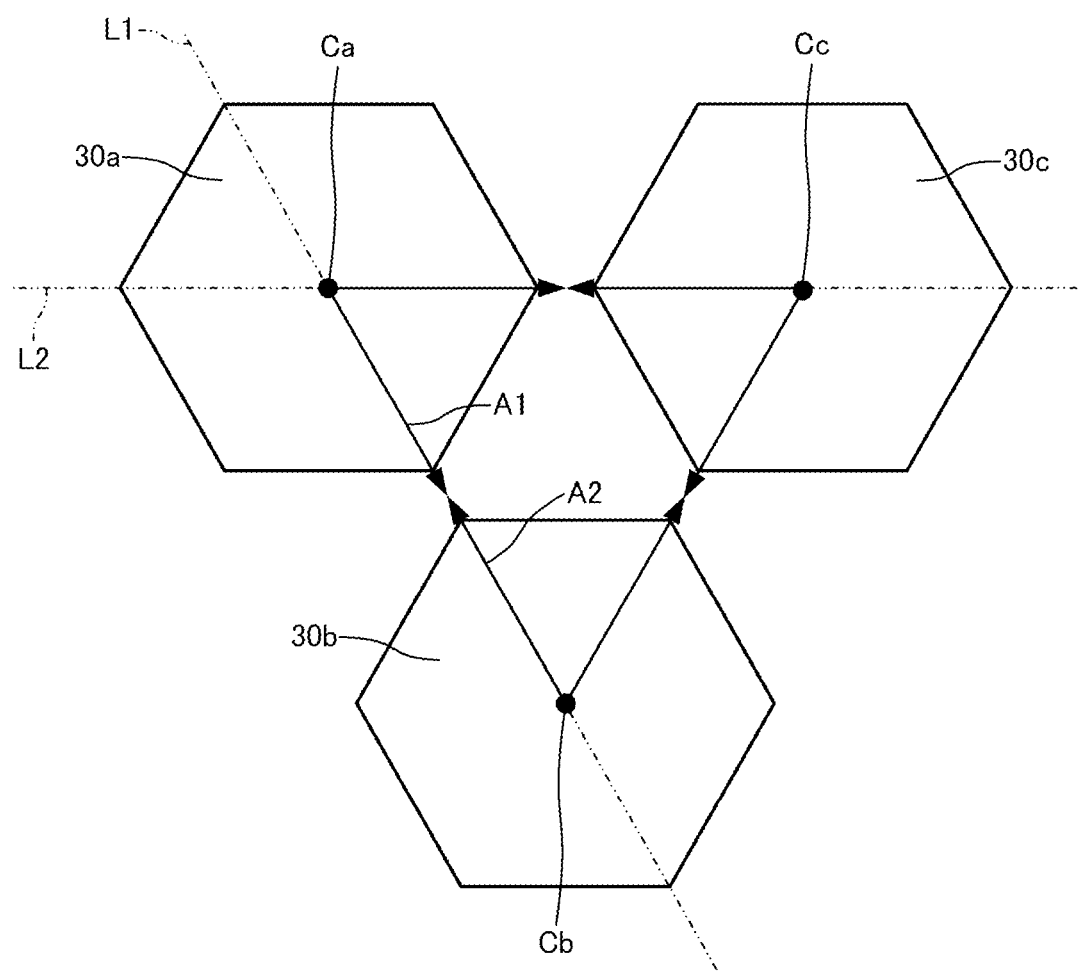
FIG. 12 is a plan view schematically showing columnar portions arranged in a regular triangular lattice form.

Note that the distance between the centers Ca, Cb shown in FIG. 10 is the same as the distance between the centers Ca, Cb shown in FIGS. 11 and 12. Further, the distance between the centers Ca, Cc shown in FIG. 10 is the same as the distance between the centers Ca, Cc shown in FIGS. 11 and 12.

2.2. Method of Manufacturing Light Emitting Device

Next, a method of manufacturing the light emitting device 200 according to the second embodiment will be explained. The method of manufacturing the light emitting device 200 according to the second embodiment is basically the same as the method of manufacturing the light emitting device 100 according to the above described first embodiment except that the plurality of columnar portions 30 are arranged in the regular triangular lattice form. Accordingly, the detailed explanation thereof will be omitted.

2.3. Modified Example of Light Emitting Device

Figure 13:
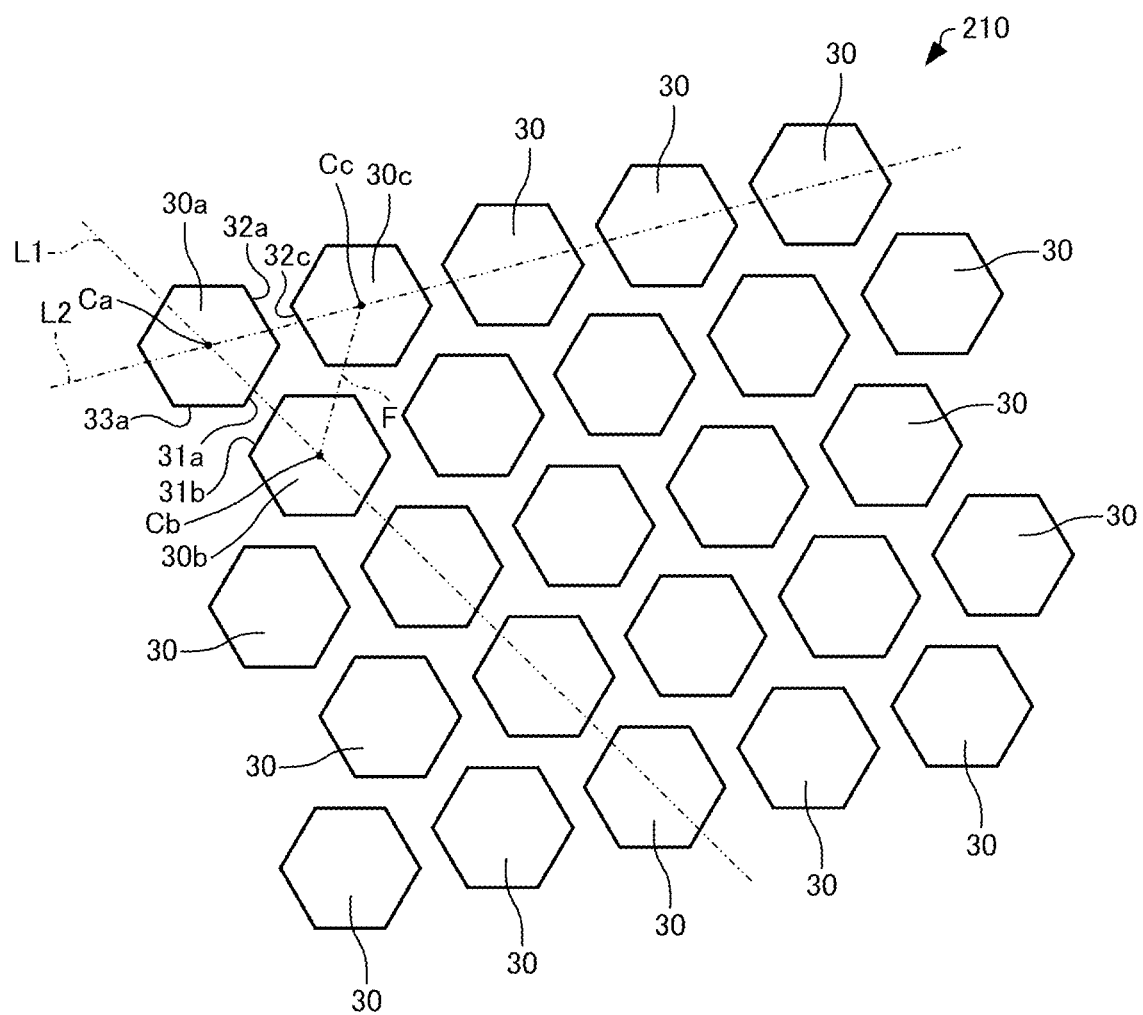
FIG. 13 is a plan view schematically showing a light emitting device according to a modified example of the second embodiment.
Figure 14:
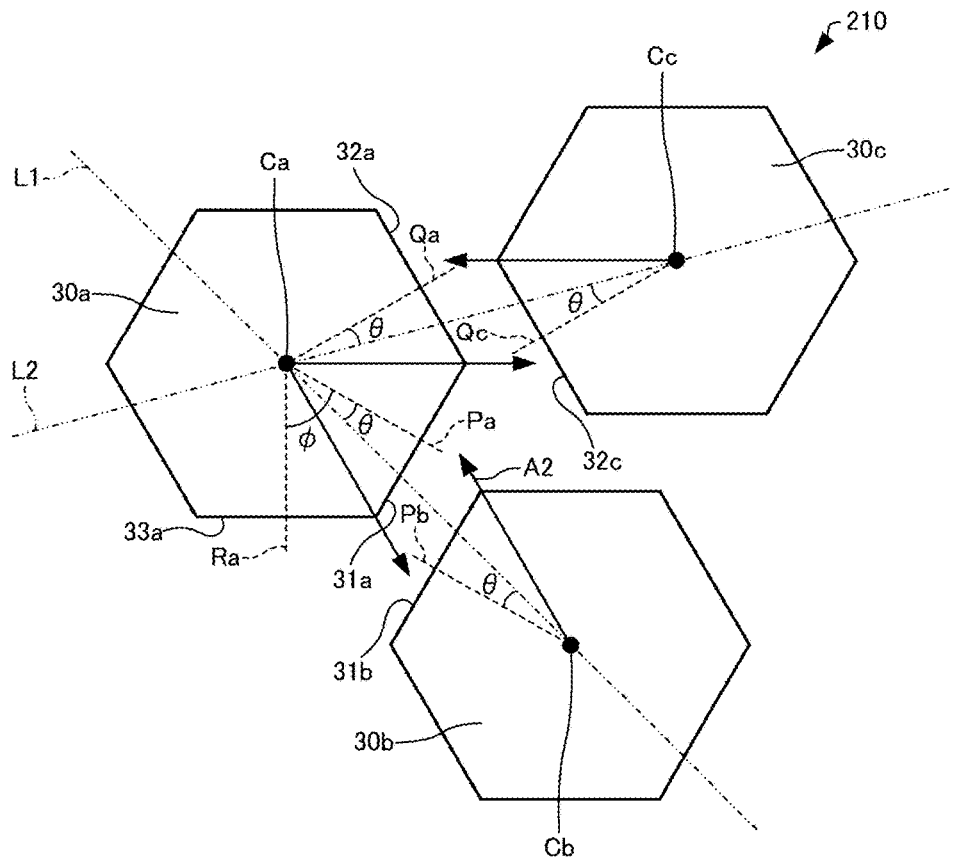
FIG. 14 is a plan view schematically showing the light emitting device according to the modified example of the second embodiment.

Next, a light emitting device according to a modified example of the second embodiment will be explained with reference to the drawings. FIGS. 13 and 14 are plan views schematically showing the light emitting device 210 according to the modified example of the second embodiment. Note that, for convenience, in FIG. 13, illustration of the other members than the columnar portions 30 is omitted. Further, in FIG. 14, illustration of the other members than the columnar portions 30*a*, 30*b*, 30*c* is omitted.

As below, in the light emitting device 210 according to the modified example of the second embodiment, the differences from the example of the light emitting device 200 according to the above described second embodiment will be explained and the explanation of the same items will be omitted.

As shown in FIGS. 13 and 14, the light emitting device 210 is different from the above described light emitting device 200 in that the line L1 is inclined relative to a perpendicular Ra of the m-plane 33*a* of the columnar portion 30*a* at from 38 degrees to 52 degrees in the plan view as seen from the layered direction. That is, an angle φ of the line L1 relative to the perpendicular Ra is from 38 degrees to 52 degrees. In the plan view as seen from the layered direction, the m-plane 33*a* is an m-plane connected to the m-plane 31*a* in a clockwise direction.

A method of manufacturing the light emitting device 210 is basically the same as the above described method of manufacturing the light emitting device 200 except that the line L1 is inclined relative to the perpendicular Ra of the m-plane 33*a* at from 38 degrees to 52 degrees.

In the light emitting device 210, in the plan view as seen from the layered direction, the line L1 is inclined relative to the perpendicular Ra of the m-plane 33*a* connected to the m-plane 31*a* in the clockwise direction at from 38 degrees to 52 degrees. Accordingly, in the light emitting device 210, contact between the adjacent columnar portions 30*a*, 30*b* may be suppressed more realiably.

Here, as shown in "4. Practical Examples and Comparative Examples", which will be described later, a contact prevention effect between the adjacent columnar portions was confirmed when φ is 38 degrees. On the other hand, when φ is 60 degrees, the line L1 is orthogonal to the m-plane and is substantially the same as that in the example shown in FIG. 11. Therefore, within the range 38°≤φ≤52°, which is obtained by subtraction of 8 degrees from 60 degrees, the contact between the adjacent columnar portions 30*a*, 30*b* may be suppressed more reliably.

3. Third Embodiment

Figure 15:
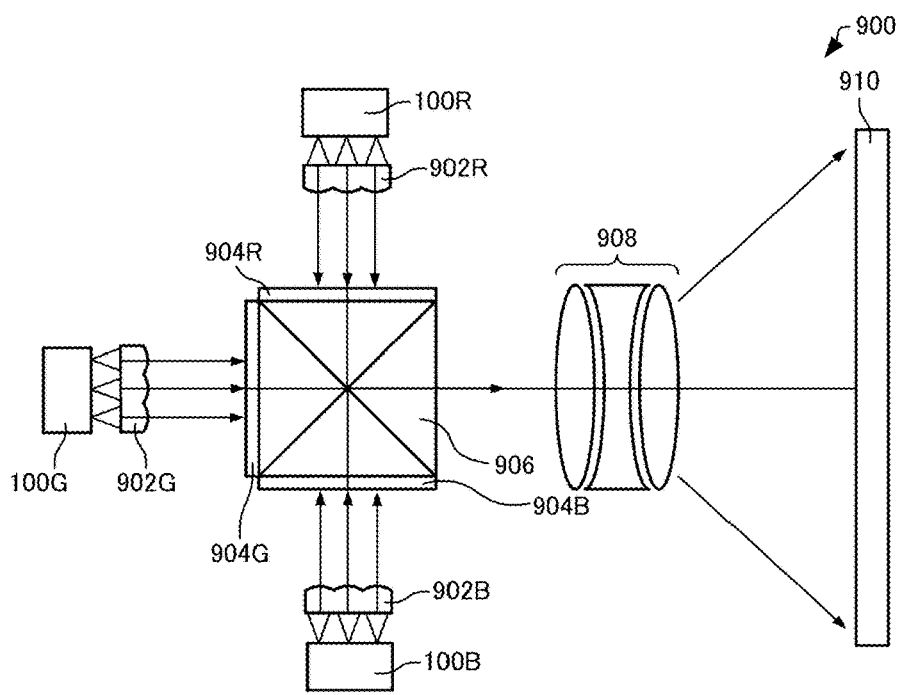
FIG. 15 schematically shows a projector according to a third embodiment.

Next, a projector according to the third embodiment will be explained with reference to the drawings. FIG. 15 schematically shows the projector 900 according to the third embodiment.

The projector 900 has the light emitting devices 100 as e.g. light sources.

The projector 900 has a housing (not shown) and a red light source 100R, a green light source 100G, and a blue light source 100B provided within the housing and outputting a red light, a green light, and a blue light, respectively.

Note that, for convenience, in FIG. 15, the red light source 100R, the green light source 100G, and the blue light source 100B are simplified.

The projector 900 further has a first lens array 902R, a second lens array 902G, a third lens array 902B, a first light modulation device 904R, a second light modulation device 904G, a third light modulation device 904B, and a projection device 908 provided within the housing. The first light modulation device 904R, the second light modulation device 904G, and the third light modulation device 904B are e.g. transmissive liquid crystal light valves. The projection device 908 is e.g. a projection lens.

The light output from the red light source 100R enters the first lens array 902R. The light output from the red light source 100R is collected and may be superimposed, for example, by the first lens array 902R.

The light collected by the first lens array 902R enters the first light modulation device 904R. The first light modulation device 904R modulates the entering light according to image information. Then, the projection device 908 enlarges and projects an image formed by the first light modulation device 904R on a screen 910.

The light output from the green light source 100G enters the second lens array 902G. The light output from the green light source 100G is collected and may be superimposed, for example, by the second lens array 902G.

The light collected by the second lens array 902G enters the second light modulation device 904G. The second light modulation device 904G modulates the entering light according to the image information. Then, the projection device 908 enlarges and projects an image formed by the second light modulation device 904G on the screen 910.

The light output from the blue light source 100B enters the third lens array 902B. The light output from the blue light source 100B is collected and may be superimposed, for example, by the third lens array 902B.

The light collected by the third lens array 902B enters the third light modulation device 904B. The third light modulation device 904B modulates the entering light according to the image information. Then, the projection device 908 enlarges and projects an image formed by the third light modulation device 904B on the screen 910.

Further, the projector 900 may have a cross dichroic prism 906 that combines and guides the lights output from the first light modulation device 904R, the second light modulation device 904G, and the third light modulation device 904B to the projection device 908.

The three color lights modulated by the first light modulation device 904R, the second light modulation device 904G, and the third light modulation device 904B enter the cross dichroic prism 906. The cross dichroic prism 906 is formed by bonding of four rectangular prisms, and a dielectric multilayer film that reflects the red light and a dielectric multilayer film that reflects the blue light are placed on the inner surfaces thereof. The three color lights are combined by these dielectric multilayer films and a light representing a color image is formed. The combined light is projected by the projection device 908 on the screen 910 and the enlarged image is displayed.

Note that the red light source 100R, the green light source 100G, and the blue light source 100B may control the light emitting devices 100 as pixels of pictures according to the image information, and thereby, directly form the pictures without using the first light modulation device 904R, the second light modulation device 904G, and the third light modulation device 904B. Further, the projection device 908 may enlarge and project the pictures formed by the red light source 100R, the green light source 100G, and the blue light source 100B on the screen 910.

In the above described example, the transmissive liquid crystal light valves are used as the light modulation devices, however, light valves of other types than liquid crystal may be used or reflective light valves may be used. The light valves include e.g. reflective liquid crystal light valves and digital micro mirror devices. The configuration of the projection device is appropriately changed according to the type of the light valves in use.

The light source can be applied to a light source device of a scanning image display apparatus having a scanning unit in which an image having a desired size is displayed on a display surface by scanning with lights from the light source on a screen.

The application of the light emitting device according to the present disclosure is not limited to the above described embodiments, but the device may be used for other apparatuses than the projector. The application to other apparatuses than the projector includes light sources for e.g. illuminations indoor or outdoor, back lights for display, laser printers, scanners, on-vehicle lights, sensing devices using lights, communication devices, etc.

4. Practical Examples and Comparative Examples

Practical examples and comparative examples will be shown for more specific explanation of the present disclosure. Note that the present disclosure is not limited by the following practical examples and comparative examples.

On a sapphire substrate, an n-type GaN was grown as a buffer layer by the MOCVD method. Then, a mask layer was formed on the buffer layer by the sputtering method, and opening portions having circular planar shapes were formed in the mask layer by patterning. Then, using the mask layer as a mask, an n-type GaN was formed and a plurality of columnar portions were formed. In the above described sample, the arrangement of the columnar portions was varied.

Practical example 1 corresponds to the light emitting device shown in FIGS. 2 and 3 in which the plurality of columnar portions are arranged in the square lattice form and θ is 8 degrees.

Practical example 2 corresponds to the light emitting device shown in FIGS. 9 and 10 in which the plurality of columnar portions are arranged in the regular triangular lattice form and θ is 8 degrees.

Practical example 3 corresponds to the light emitting device shown in FIGS. 13 and 14 in which the plurality of columnar portions are arranged in the regular triangular lattice form and φ is 38 degrees.

Comparative example 1 corresponds to the light emitting device shown in FIG. 4 in which the plurality of columnar portions are arranged in the square lattice form and the L1 is orthogonal to the m-planes.

Comparative example 2 corresponds to the light emitting device shown in FIG. 11 in which the plurality of columnar portions are arranged in the regular triangular lattice form and the L1 is orthogonal to the m-planes.

Comparative example 3 corresponds to the light emitting device shown in FIG. 12 in which the plurality of columnar portions are arranged in the regular triangular lattice form and the L1 passes through the vertices.

Figure 16:
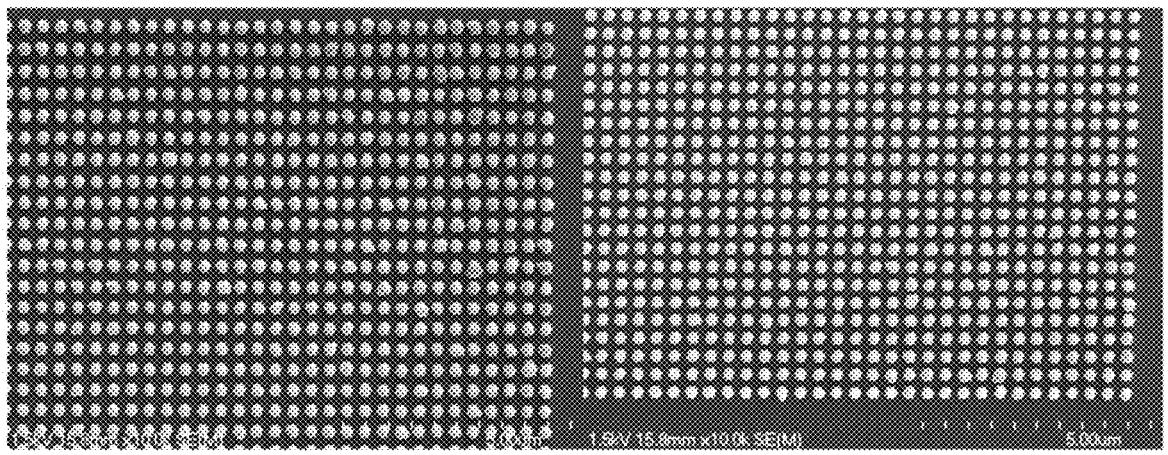
FIG. 16 is a SEM image of practical example 1.
Figure 17:
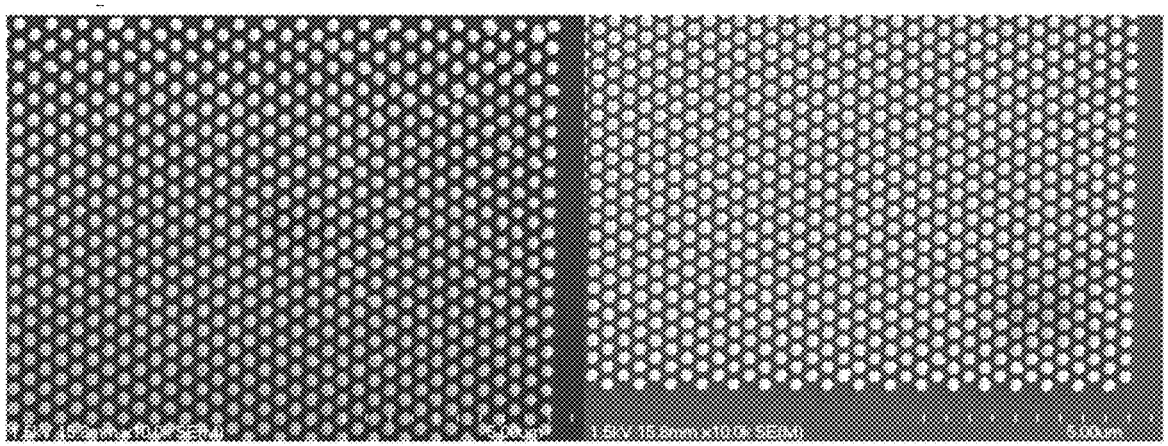
FIG. 17 is a SEM image of practical example 2.
Figure 18:
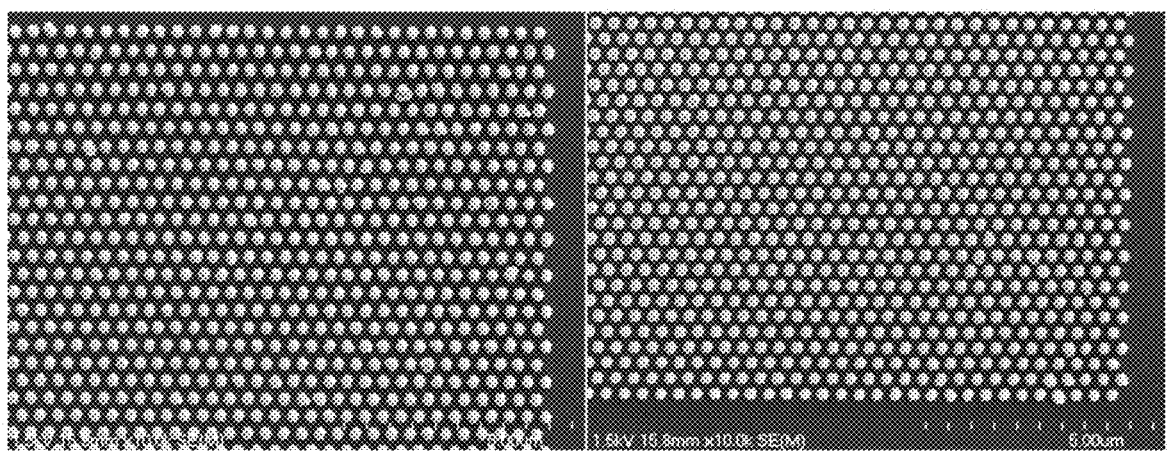
FIG. 18 is a SEM image of practical example 3.
Figure 19:
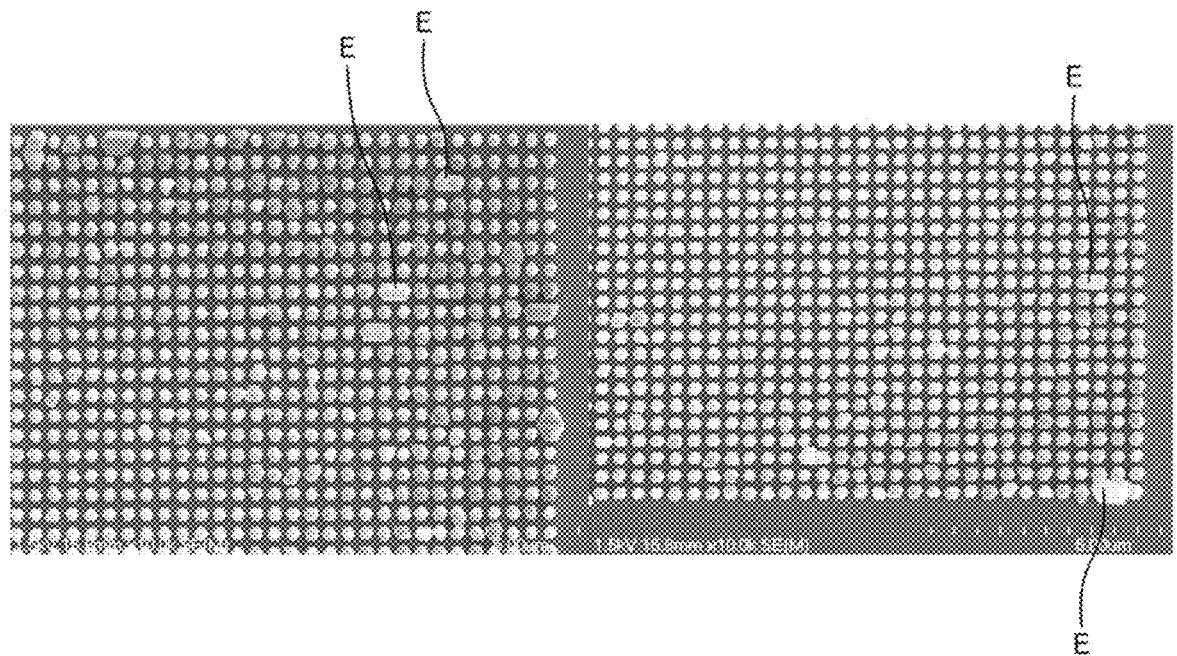
FIG. 19 is a SEM image of comparative example 1.
Figure 20:
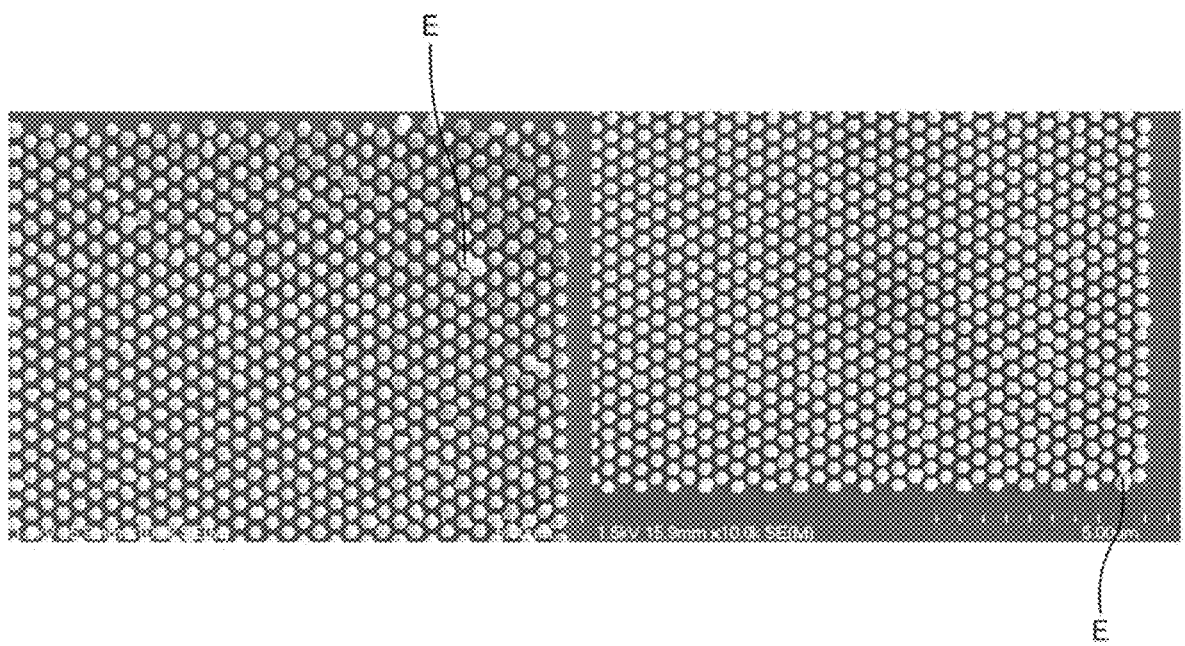
FIG. 20 is a SEM image of comparative example 2.
Figure 21:
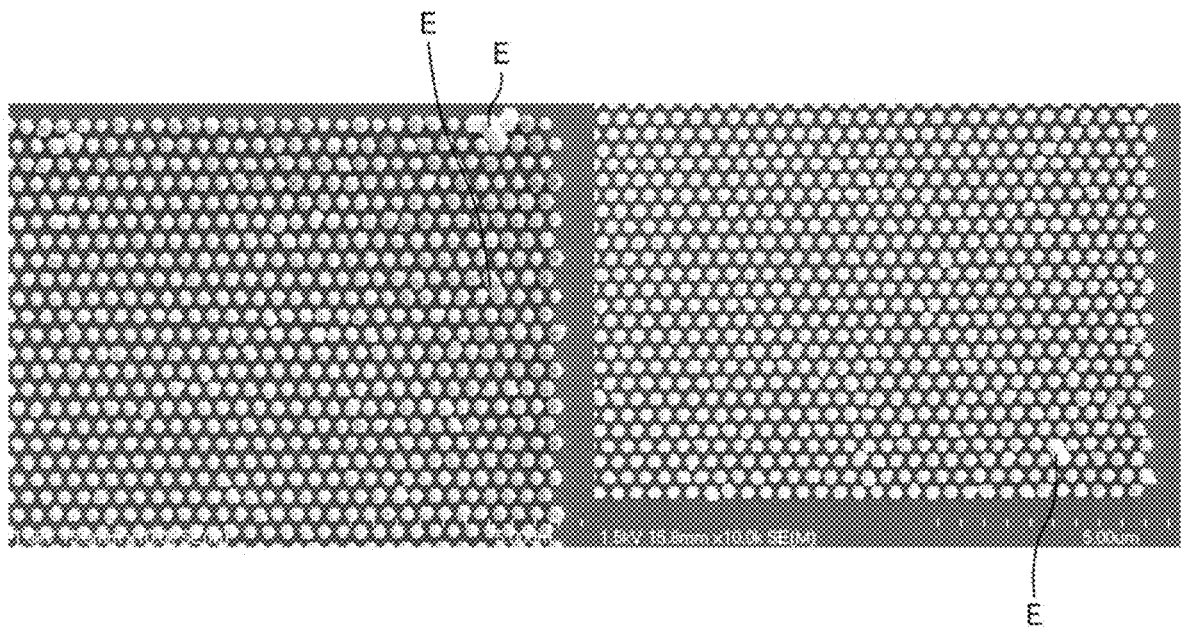
FIG. 21 is a SEM image of comparative example 3.

SEM (Scanning Electron Microscope) observations of practical examples 1 to 3 and comparative examples 1 to 3 were performed. FIG. 16 is the SEM image of practical example 1. FIG. 17 is the SEM image of practical example 2. FIG. 18 is the SEM image of practical example 3. FIG. 19 is the SEM image of comparative example 1. FIG. 20 is the SEM image of comparative example 2. FIG. 21 is the SEM image of comparative example 3.

In comparative examples 1 to 3, as shown in FIGS. 19 to 21, contact between the adjacent columnar portions and growths of GaN from the contact locations in portions E were confirmed. On the other hand, in practical examples 1 to 3, as shown in FIGS. 16 to 18, no contact between the adjacent columnar portions were confirmed. Therefore, practical examples 1 to 3 show that contact between the adjacent columnar portions may be suppressed.

The present disclosure may be embodied by omission of apart of the configuration or combination of the respective embodiments and modified examples within a range in which the characteristics and the effects described in this application are provided.

The present disclosure is not limited to the above described embodiments, but other various modifications can be made. For example, the present disclosure includes substantially the same configurations as the configurations described in the embodiments. "Substantially the same configurations" are e.g. the configurations having the same functions, methods, and results or the configurations having the same purposes and effects. Further, the present disclosure includes configurations in which inessential parts of the configurations described in the embodiments are replaced. Furthermore, the present disclosure includes configurations that exert the same effects or configurations that may achieve the same purposes as those of the configurations described in the embodiments. Moreover, the present disclosure includes configurations with the addition of known techniques to the configurations described in the embodiments.

What is claimed is:

1. A light emitting device comprising:
a substrate; and
a laminated structure provided on the substrate, wherein the laminated structure has a plurality of columnar portions,
each columnar portion contains a material having a wurtzite-type crystal structure,
in a plan view as seen from a layered direction of the laminated structure:
the plurality of columnar portions are arranged in a square lattice form or rectangular lattice form,
a line passing through centers of the adjacent columnar portions is inclined relative to m-planes of the columnar portions located between the centers of the adjacent columnar portions,
vertices of the adjacent columnar portions are not placed on the line, and
the line is inclined at from 8 degrees to 22 degrees relative to perpendiculars of the m-planes.

2. A projector comprising the light emitting device according to claim 1.

3. A light emitting device comprising:
a substrate; and
a laminated structure provided on the substrate, wherein the laminated structure has a plurality of columnar portions,
each columnar portion contains a material having a wurtzite-type crystal structure,
in a plan view as seen from a layered direction of the laminated structure:
the plurality of columnar portions are arranged in a regular triangular lattice form, a line passing through centers of the adjacent columnar portions is inclined relative to m-planes of the columnar portions located between the centers of the adjacent columnar portions, vertices of the adjacent columnar portions are not placed on the line, and the line is inclined at from 8 degrees to 22 degrees relative to perpendiculars of the m-planes.

4. A method of manufacturing a light emitting device comprising forming a laminated structure having a plurality of columnar portions on a substrate, wherein each columnar portion contains a material having a wurtzite-type crystal structure, at the forming of the laminated structure and in a plan view as seen from a layered direction of the laminated structure:

the plurality of columnar portions are arranged in a square lattice form or rectangular lattice form, a line passing through centers of the adjacent columnar portions is inclined relative to m-planes of the columnar portions located between the centers of the adjacent columnar portions, vertices of the adjacent columnar portions are not placed on the line, and the line is inclined at from 8 degrees to 22 degrees relative to perpendiculars of the m-planes.

5. A method of manufacturing a light emitting device comprising forming a laminated structure having a plurality of columnar portions on a substrate, wherein each columnar portion contains a material having a wurtzite-type crystal structure, at the forming of the laminated structure and in a plan view as seen from a layered direction of the laminated structure:

the plurality of columnar portions are arranged in a regular triangular lattice form, a line passing through centers of the adjacent columnar portions is inclined relative to m-planes of the columnar portions located between the centers of the adjacent columnar portions, vertices of the adjacent columnar portions are not placed on the line, and the line is inclined at from 8 degrees to 22 degrees relative to perpendiculars of the m-planes.

6. A light emitting device comprising:

a substrate; and a laminated structure provided on the substrate, wherein the laminated structure has a plurality of columnar portions, each columnar portion contains a material having a wurtzite-type crystal structure, in a plan view as seen from a layered direction of the laminated structure:

the plurality of columnar portions are arranged in a regular triangular lattice form, a line passing through centers of the adjacent columnar portions is inclined relative to m-planes of the columnar portions located between the centers of the adjacent columnar portions, vertices of the adjacent columnar portions are not placed on the line, and in the plan view as seen from the layered direction, the line is inclined at from 38 degrees to 52 degrees relative to a perpendicular of an m-plane connected to the m-plane in a clockwise direction.

7. A method of manufacturing a light emitting device comprising forming a laminated structure having a plurality of columnar portions on a substrate, wherein each columnar portion contains a material having a wurtzite-type crystal structure, at the forming of the laminated structure and in a plan view as seen from a layered direction of the laminated structure:

the plurality of columnar portions are arranged in a regular triangular lattice form, a line passing through centers of the adjacent columnar portions is inclined relative to m-planes of the columnar portions located between the centers of the adjacent columnar portions, and vertices of the adjacent columnar portions are not placed on the line, wherein, at the forming of the laminated structure, in the plan view as seen from the layered direction, the line is inclined at from 38 degrees to 52 degrees relative to a perpendicular of an m-plane connected to the m-plane in a clockwise direction.

* * * * *